(12) United States Patent
Norman et al.

(10) Patent No.: US 12,287,624 B2
(45) Date of Patent: Apr. 29, 2025

(54) TIME CONSTRAINT MANAGEMENT AT A MANUFACTURING SYSTEM

(71) Applicant: APPLIED MATERIALS, INC., Santa Clara, CA (US)

(72) Inventors: David E Norman, Bountiful, UT (US); Fumio Kawada, Kakamigahara (JP); Yuh Lin Ng, Kallang / Whampoa (SG)

(73) Assignee: Applied Materials, Inc., Santa Clara, CA (US)

( * ) Notice: Subject to any disclaimer, the term of this patent is extended or adjusted under 35 U.S.C. 154(b) by 11 days.

(21) Appl. No.: 16/939,772

(22) Filed: Jul. 27, 2020

(65) Prior Publication Data
US 2022/0026891 A1 Jan. 27, 2022

(51) Int. Cl.
*G05B 19/418* (2006.01)
*H01L 31/18* (2006.01)

(52) U.S. Cl.
CPC . *G05B 19/41885* (2013.01); *G05B 19/41805* (2013.01); *G05B 19/4183* (2013.01); *G05B 19/41865* (2013.01); *H01L 31/1892* (2013.01)

(58) Field of Classification Search
CPC ........ G05B 19/41885; G05B 19/41805; G05B 19/4183; G05B 19/41865; G05B 2219/32265; H01L 31/1892
See application file for complete search history.

(56) References Cited

U.S. PATENT DOCUMENTS 5,801,945 A * 9/1998 Comer .............. G05B 19/41865
700/99
6,230,068 B1 * 5/2001 Wu .................. G05B 19/41865
438/149

(Continued)

FOREIGN PATENT DOCUMENTS

JP H07283093 A 10/1995
JP H0831709 A 2/1996

(Continued)

OTHER PUBLICATIONS

Nakatsu, Production support program, method and system for assembly production, 2004, Google patents, note this is a machine translation of JP2004185252A (Year: 2004).*

(Continued)

*Primary Examiner* — Robert E Fennema
*Assistant Examiner* — Yvonne Trang Follansbee
(74) *Attorney, Agent, or Firm* — Lowenstein Sandler LLP

(57) ABSTRACT

A method for time constraint management at a manufacturing system is provided. A first request to initiate a set of operations to be run at the manufacturing system is received. The set of operations include one or more operations that each have one or more time constraints. A first set of candidate substrates to be processed during the set of operations is determined. A first simulation of the set of operations for the first set of candidate substrates is run over a first period of time. The simulation generates a first simulation output indicate a first number of candidate substrates that were successfully processed during each of the simulated set of operations to reach the end of the first time period. The set of operations is initiated at the manufacturing system to process the first number of candidate substrates over the first time period.

20 Claims, 6 Drawing Sheets

(56) References Cited

U.S. PATENT DOCUMENTS

| | | | |
|---|---|---|---|
| 6,360,133 B1* | 3/2002 | Campbell | H01L 21/67276 700/121 |
| 7,257,459 B1* | 8/2007 | Qu | G05B 19/41865 700/121 |
| 8,978,045 B2 | 3/2015 | Norman | |
| 9,665,668 B2 | 5/2017 | Norman et al. | |
| 10,295,979 B2 | 5/2019 | Norman | |
| 2003/0065416 A1* | 4/2003 | Vollmar | G06Q 10/06 700/99 |
| 2003/0171835 A1* | 9/2003 | Suh | G05B 19/41865 700/95 |
| 2005/0055105 A1* | 3/2005 | Wu | G05B 19/41865 700/1 |
| 2006/0155409 A1* | 7/2006 | Lan | G05B 19/41865 700/112 |
| 2007/0279652 A1* | 12/2007 | McElvain | H04N 1/4055 358/1.9 |
| 2008/0051929 A1 | 2/2008 | Hongkham et al. | |
| 2008/0195241 A1* | 8/2008 | Lin | G05B 19/41865 700/100 |
| 2009/0089029 A1* | 4/2009 | Sturrock | G06F 30/20 703/7 |
| 2009/0105854 A1* | 4/2009 | Rawlins | G05B 19/41865 700/32 |
| 2014/0148924 A1 | 5/2014 | Brak et al. | |
| 2017/0083000 A1* | 3/2017 | Wu | G05B 19/402 |
| 2018/0107737 A1* | 4/2018 | Sage | H04L 43/0805 |
| 2019/0348331 A1 | 11/2019 | Cao et al. | |
| 2020/0019910 A1 | 1/2020 | Norman et al. | |
| 2021/0181726 A1* | 6/2021 | Shi | G05B 19/41865 |

FOREIGN PATENT DOCUMENTS

| | | | |
|---|---|---|---|
| JP | 2004185252 A | * | 7/2004 |
| JP | 2011146448 A | | 7/2011 |
| JP | 2013033466 A | | 2/2013 |
| JP | 2016133925 A | | 7/2016 |
| JP | 2018117000 A | | 7/2018 |
| TW | 201516598 A | | 5/2015 |
| TW | 201941328 A | | 10/2019 |
| WO | 0154187 A1 | | 7/2001 |
| WO | 2019075174 A1 | | 4/2019 |

OTHER PUBLICATIONS

PCT International Search Report and Written Opinion for International Application No. PCT/US2021/043037 mailed Nov. 8, 2021, 9 pages.

Extended European Search Report for European Application No. 21850691.3, mailed Jul. 23, 2024, 12 Pages.

* cited by examiner

TIME CONSTRAINT MANAGEMENT AT A MANUFACTURING SYSTEM

TECHNICAL FIELD

Embodiments of the present disclosure relate, in general, to manufacturing systems and more particularly to time constraint management.

BACKGROUND

Before a substrate becomes a finished product (e.g., a wafer, an electronic device, etc.), the substrate can be processed according to a set of operations each performed at a tool of a manufacturing system. In some instances one or more operations can be subject to a time constraint. A time constraint refers to a particular amount of time after an operation is completed that a subsequent operation is to be completed. For example, a substrate can be processed according to a first operation where a first material is deposited on a surface of the substrate and a second operation where a second material is deposited on the first material. The first operation and the second operation can be subject to a time constraint where the second material is to be deposited on the first material within a particular amount of time, otherwise the first material can begin to degrade and the substrate cannot be used to produce a finished product (i.e., becomes unusable). A time constraint window refers to a particular amount of time to complete an operation that prompts a time constraint (referred to as an initiating operation) and the amount of time after the initiating operation is completed that a subsequent operation (referred to a completion operation) is to be completed. In some instances, one or more operations can be performed between the initiating operation and the completion operation.

In most instances, an operation cannot be started for a substrate when the substrate arrives at the tool, as the tool can be processing other substrates. As such, an operator of the manufacturing system (e.g., an industrial engineer, a process engineer a system engineer, etc.) schedules operations to run at particular times in order to satisfy a time constraint associated with the operation. For example, an operator can delay an operation from being performed for a substrate until each tool set to perform an operation associated with a time constraint has capacity to perform the operation within the time constraint window.

In some instances, a completion operation for a first time constraint window can also be an initiating operation for a second time constraint window. In such instances, an operator of a manufacturing system can schedule an initiating operation for the first time constraint window to start at a particular time to satisfy a first time constraint of the first time constraint window and a second time constraint of the second time constraint window. In other instances, an operation can be a completion operation for both a first time constraint window and a second time constraint window. In such instances, an operator can schedule initiating operations for the first time constraint window and the second time constraint window to start at a particular time to satisfy a first time constraint of the first time constraint window and a second time constraint of the second time constraint window As manufacturing systems become more complex, more operations are subject to time constraints. In order to schedule a substrate to be started at an initiating operation, an operator (e.g., using a computing system) accounts for all time constraints that could be prompted by the initiating operation. To account for all time constraints that could be prompted by the initiating operation, the operator accounts for a capacity of each tool that can perform the initiating operation, the completion operation, and each operation in between. In some instances a time constraint window including the initiating operation can correspond to a significant amount of time (e.g., 6 hours, 8 hours, 12 hours, 24 hours, etc.). The operator can have difficulty in accounting for each time constraint and capacities for each tool of the manufacturing system for a significant amount of time into the future. For some computing systems, this accounting can be classified as a NP-hard (non-deterministic polynomial-time hard) problem. As such, the operator can be unsuccessful in scheduling a substrate to be started at each initiating operation of the set of operations so that each time constraint can be satisfied. As a result, the substrate can violate a time constraint of the set of operations and become unusable. Each substrate that becomes unusable can reduce overall system throughput and contribute to increasing overall system latency.

SUMMARY

Some of the embodiments described cover a method including receiving a first request to initiate a set of operations to be run at a manufacturing system. The set of operations include one or more operations that each have one or more time constraints. The method further includes determining a first set of candidate substrates to be processed during the set of operations. The method further includes running a first simulation of the set of operations for the first set of candidate substrates over a first time period. The first simulation generates a first simulation output indicating a first number of candidate substrates that were successfully processed during each of the simulated set of operations to reach an end of the first time period. The method further includes initiating the set of operations at the manufacturing system to process the first number of candidate substrates over the first time period.

In some embodiments, a memory and a processing device coupled to the memory. The processing device is to receive a first request to initiate a set of operations to be run at a manufacturing system. The set of operations comprises one or more operations that each have one or more time constraints. The processing device is further to determine a first set of candidate substrates to be processed during the set of operations. The processing device is further to run a first simulation of the set of operations for the first set of candidate substrates over a first time period. The first simulation generates a first simulation output indicating a first number of candidate substrates that were successfully processed during each of the simulated set of operations to reach an end of the first time period. The processing device is further to initiate the set of operations at the manufacturing system to process the first number of candidate substrates over the first time period.

In some embodiments, a non-transitory computer readable storage medium includes instructions that, when executed by a processing device, cause the processing device to receive a first request to initiate a set of operations to be run at a manufacturing system. The set of operations comprises one or more operations that each have one or more time constraints. The processing device is further to determine a first set of candidate substrates to be processed during the set of operations. The processing device is further to run a first simulation of the set of operations for the first set of candidate substrates over a first time period. The first simulation generates a first simulation output indicating a first number of candidate substrates that were successfully processed during each of the simulated set of operations to reach an end of the first time period. The processing device is further to initiate the set of operations at the manufacturing system to process the first number of candidate substrates over the first time period.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
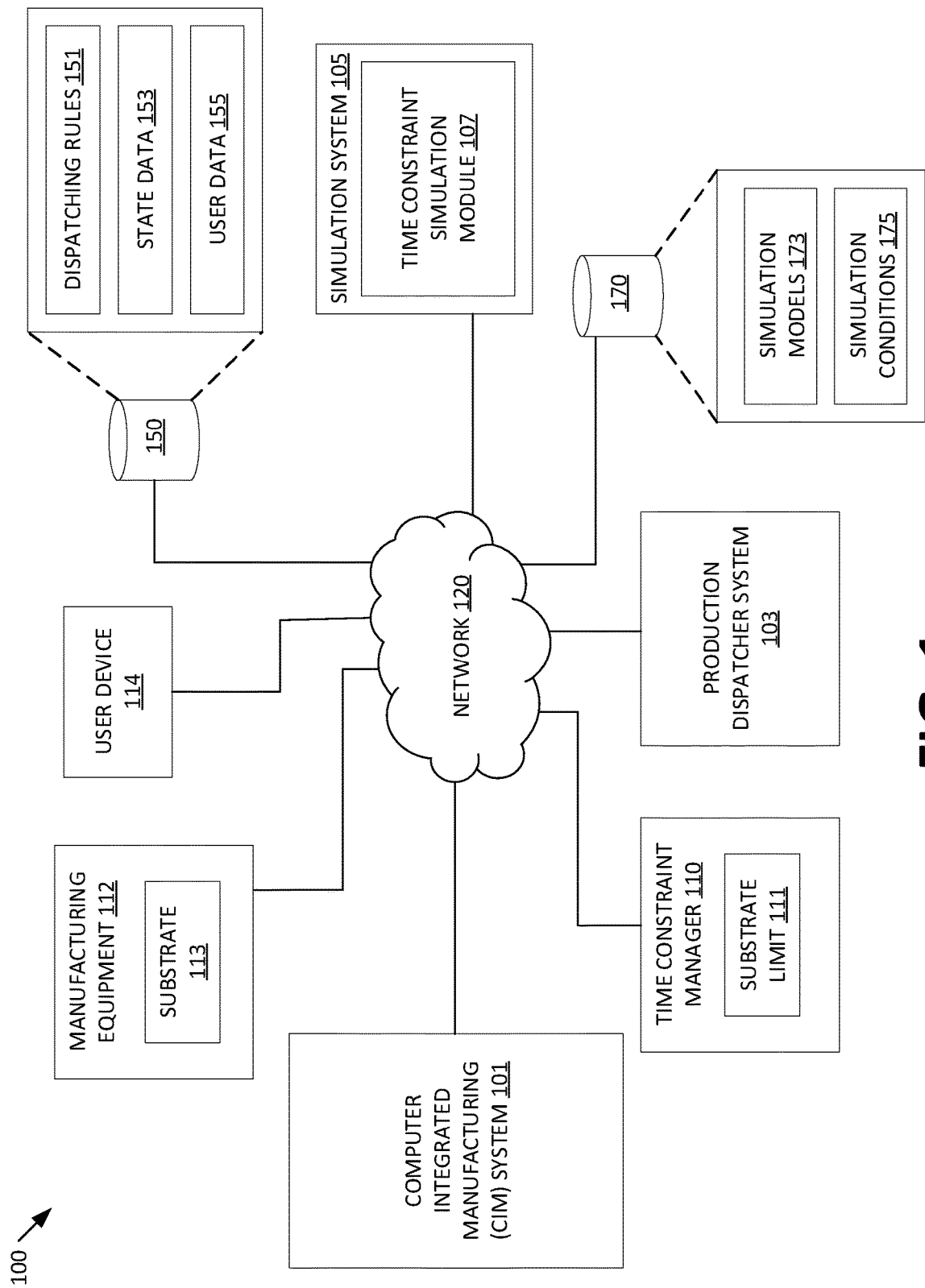
FIG. 1 is a block diagram illustrating a production environment, according to aspects of the present disclosure.

Embodiments disclosed herein include methods and systems for time constraint management at a manufacturing system. In some processes, a series of operations can be performed at various stations of the manufacturing system. For example, a series of operations can be performed to deposit a coating (or multiple coatings) on a surface of a substrate and etch a three-dimensional pattern into the coating. In some instances, one or more of the series of operations can be subject to a time constraint. A time constraint can refer to a limitation or protocol in which, after an operation is performed at the manufacturing system, a subsequent operation is to be completed within a particular amount of time. For example, the manufacturing system can be subject to a time constraint where the etch process is to be performed for the substrate within a particular number of hours (e.g., 12 hours) after the coating is deposited on the surface of a substrate. If the time constraint is not satisfied (e.g., if the etch process is not performed within the particular number of hours), the substrate can become defective and unusable.

Embodiments of the present disclosure are directed to managing time constraints at a manufacturing system. A processing device, such as a processing device executing a time constraint window manager (e.g., time constraint window manager 110 of FIG. 1), can receive a request to initiate operations to be run at a manufacturing system, where one or more operations are subject to a time constraint. The processing device can determine, in view of the time constraints, a number of substrates that can be successfully processed at the manufacturing system within a particular time period. For example, the processing device can identify a set of candidate substrates at the manufacturing system to be processed during the set of operations. In some embodiments, the processing device can determine the set of candidate substrates based on a queue of substrates to be processed at the manufacturing system.

The processing device can run a simulation of the set of operations for the set of candidate substrates over a particular time period. The simulation can be performed based on dispatching rules for the manufacturing system (e.g., rules used to determine which action should be performed at the manufacturing system at a given time), state data associated with the manufacturing system, and/or user data provided by a user of the manufacturing system (e.g., an operation, an industrial engineer, a process engineer, a system engineer, etc.).

The processing device can determine the simulation time period by determining a set of time constraint windows associated with each operation that has one or more time constraints. A time constraint window refers to a particular amount of time to complete an operation that initiates the time constraint (referred to as an initiating operation) and the amount of time after the initiating operation is completed that a subsequent operation (referred to a completion operation) is to be completed. In some embodiments, one or more operations can be performed between the initiating operation and the completion operation and are associated with the time constraint window. The processing device can determine time constraint windows for each time constraint associated with the set of operations and can determine the simulation time period based on the largest time constraint window.

The simulation can generate an output indicating the number of candidate substrates that were successfully processed during each of the simulated set of operations to reach an end of the simulation time period. The processing device can initiate the set of operations at the manufacturing system to process the number of candidate substrates over the time period based on the simulation output. For example, the output of the first simulation can indicate 90 of 100 candidate substrates were successfully processed during each of the simulated operations to reach the end of a 12 hour time period. As such, the processing device can initiate the set of operations at the manufacturing system to process 90 substrates during a 12 hour time period. In some embodiments, the processing device can initiate the set of operations at the manufacturing system by setting a substrate counter value for a first operation of the set of operations to correspond to the number of candidate substrates from the simulation output. The substrate counter defines a total number of substrates at the manufacturing system (e.g., in the substrate queue) to be initiated at the first operation over the time period (e.g., the 12 hour time period).

In some embodiments, the simulation can generate another simulation output that indicates a number of additional substrates that could be successfully processed at the manufacturing equipment within the time period. For example, the simulation can be performed for 100 candidate substrates at the manufacturing system. An output of the simulation can indicate that 100 candidate substrates were successfully processed at each of the simulated steps and another output of the simulation can indicate that the manufacturing system could have successfully processed 10 additional candidate substrates during the simulation time period (i.e., the manufacturing system has additional substrate capacity). Based on the additional simulation output, the processing device can identify additional candidate substrates (e.g., from the substrate queue) and can initiate the set of operations to process the number of candidate substrates from the simulation output and the additional candidate substrates over the time period.

Implementations of the present disclosure address the above described deficiencies of the current technology by providing techniques for predicting a number of substrates at manufacturing system that will be successfully processed according to a set of operations having one or more time constraints. A processing device can run a simulation of the set of operations for a set of candidate substrates for time period corresponding to a significant amount of time into the future (e.g., 6 hours, 8 hours, 12 hours, 24 hours, etc.). By running the simulation, the processing device can obtain a prediction for a future state of the manufacturing system at the end of the time period. The future state of the manufacturing system can indicate a number of substrates that are likely to be successfully processed according to the set of operations over the time period. By obtaining the number of substrates that are likely to be successfully processed over the time period, the processing device can schedule an appropriate number of substrates to be initiated at the set of operations within the time period so that few or no substrates violate a time constraint for the set of operations. As a result, a small number of substrates, or approximately zero substrates, violate a time constraint of the set of operations, resulting in a significant number of substrates processed at the manufacturing system containing no or few defects. As a result, an overall system throughput increases and an overall system latency decreases, as a higher number of substrates processed at the manufacturing system become useable final products.

FIG. 1 is a block diagram illustrating a production environment 100, according to aspects of the present disclosure. A production environment 100 can include multiple systems, such as, and not limited to, a production dispatcher system 103, a simulation system 105, a time constraint window manager 110, manufacturing equipment 112 (e.g., manufacturing tools, automated devices, etc.), a user device 114, and one or more computer integrated manufacturing (CIM) systems 101. Examples of a production environment 100 can include, and are not limited to, a manufacturing plant, a fulfillment center, etc. For brevity and simplicity, a manufacturing system is used as an example of a production environment 100 throughout this description.

In some embodiments, production environment 100 can be a semiconductor manufacturing environment. In such embodiments, manufacturing equipment 112 can perform multiple different operations related to the fabrication of semiconductor wafers. For example, manufacturing equipment 112 can perform cutting operations, cleaning operations, deposition operations, etching operations, testing operations, and so forth. Aspects of the present disclosure are described with regard to fabrication of semiconductor substrates in a semiconductor manufacturing environment. However, it should be noted that implementations of the present disclosure can be applied to other production environments 100 configured to fabricate or otherwise process lots different from semiconductor substrates.

The CIM 101, production dispatcher system 103, simulation system 105, time constraint simulation module 107, time constraint window manager 110, manufacturing equipment 112, user device 114, and data stores 150, 170 can be coupled to each other via a network. The network 120 can be a local area network (LAN), a wireless network, a mobile communications network, a wide area network (WAN), such as the Internet, or similar communication system. The CIM system 101, production dispatcher system 103, simulation system 105, time constraint simulation module 107, and time constraint window manager 110 can be individually hosted or hosted in any combination together by any type of machine including server computers, gateway computers, desktop computers, laptop computers, tablet computers, notebook computers, PDAs (personal digital assistants), mobile communication devices, cell phones, smart phones, hand-held computers, or similar computing devices. In one embodiment, simulation module 107 is part of a server that is hosted on a machine.

A data store 150,170 can be a persistent storage unit. A persistent storage unit can be a local storage unit or a remote storage unit. Persistent storage units can be a magnetic storage unit, optical storage unit, solid state storage unit, electronic storage unit (main memory) or similar storage unit. Persistent storage units can be a monolithic device or a distributed set of devices. A 'set', as used herein, refers to any positive whole number of items.

A user device 114 can include a computing device such as a personal computer (PC), laptop, mobile phone, smart phone, tablet computer, netbook computer, network-connected television, etc. In some embodiments, user device 114 may provide information to a user (e.g., an operator, an industrial engineer, a process engineer, a system engineer, etc.) of production environment 100 via one or more graphical user interfaces (GUIs).

Examples of CIM systems 101 can include, and are not limited to, a manufacturing execution system (MES), enterprise resource planning (ERP), production planning and control (PPC), computer-aided systems (e.g., design, engineering, manufacturing, processing planning, quality assurance), computer numerical controlled machine tools, direct numerical control machine tools, controllers, etc.

The production dispatcher system 103 can make dispatching decisions for the production environment 100. A dispatching decision decides what action should be performed at a given time in the production environment 100. Dispatching often involves decisions such as whether the start processing a batch that has fewer substrates than allowed, or wait to start the batch until additional substrates are available so a full batch can be started. Examples of dispatching decisions can include, and are not limited to, where a substrate should be processed next in the production environment, which substrate should be picked for an idle piece of equipment in the production environment, and so forth.

The production dispatcher system 103 can use one or more dispatching rules 151 that are stored in the data store 150 to make a dispatching decision. Dispatching rules 151 can be logic that can be executed by the production dispatcher system 103. The dispatching rules 151 can be user (e.g., industrial engineer, process engineer, system engineer, etc.) defined. Examples of dispatching rules 151 can include, and are not limited to, select the highest priority substrate to work on next, select a substrate that uses the same set up which the tool is currently configured for, package items when a purchase order is complete, ship items when packaging is complete, etc. The individual dispatching rules 151 can be associated with a large number of data processes to implement the corresponding dispatching rule 151. Examples of data processes can include, and are not limited to import data, compress data, index data, filter data, perform a mathematical function on data, etc.

In some instances, manufacturing processes can include of hundreds of operations performed by manufacturing equipment 112 (e.g., tools or automated devices) within the production environment 100. In many instances, one or more operations can be subjected to a time constraint. As discussed previously, a time constraint refers to a particular amount of time after an operation is completed that a subsequent operation is to be completed. For example, after a first material is deposited on a surface of a substrate, a second material is to be deposited on the first material within a particular amount of time after the deposition of the first material. If the second coating is not deposited on the first material within the particular amount of time, the first material can begin to degrade, leaving the substrate unusable. A time constraint window refers to an amount of time to complete a first operation (referred to as an initiating operation) and the particular amount of time a second operation (referred to as a completion operation) is to be completed. In some embodiments, one or more operations performed between the initiating operation and the completion operation are also associated with the time constraint window. In accordance with the previous example, a time constraint window can refer to a first amount of time to deposit the first material on the surface of the substrate and the particular amount of time in which the second material is to be deposited on the first material. Multiple operations can be subject to one or more time constraints. In some embodiments, a completion operation for a first time constraint window can also be an initiating operation for a second time constraint window.

Time constraint window manager 110 can determine a number of substrates to start at an initiating operation of a time constraint window for a particular time period. In some embodiments, time constraint window manager 110 can determine the number of substrates to be started at the initiating operation in response to a request (e.g., from production dispatcher system 103, from an operator, etc.). The determined number of substrates is referred to as a substrate limit 111. Production dispatcher system 103 can monitor whether a number of substrates started at the initiating operation satisfies the substrate limit 111 by maintaining a substrate counter value. Production dispatcher system 103 can update the substrate counter value (e.g., decrease the substrate counter value by one) for each substrate started at the initiating operation. In some embodiments, production dispatcher system 103 can prevent a substrate from starting at the initiating operation in response to determining the substrate counter value is zero. Time constraint window manager 110 can provide the substrate counter value to production dispatcher system 103 (e.g., as a result of running a simulation at simulation system 105).

A simulation system 105 can run a simulation that is generally faster than the real-time operation of the production environment 100. For example, the simulation system 105 can run a simulation for a week of simulated time in a couple of seconds to test how well the production environment 100 operates. In one embodiment, the simulation system 105 includes a simulation module 107 to simulate dispatching rules 151 applied to one or more operations of a process at the production environment 100. In another embodiment, the simulation system 105 communicates with an external simulation module 107 to simulate dispatching rules 151.

Simulation module 107 can execute a simulation model 173 to simulate one or more operations performed at production environment 100. Simulation model 173 is a model configured to generate predictions regarding future states of manufacturing equipment 112 and/or substrates 113 processed at manufacturing equipment 113. Simulation model 173 can generate predictions by executing one or more operations based on dispatching rules 152, state data 154, and/or user data 156. In some embodiments, simulation model 173 can generate predictions by making calculations, forecasting, statistical predictions, trend analysis, and so forth. In some embodiments, simulation model 173 can be a heuristic simulation model. In other or similar embodiments, simulation model 173 can be a machine learning model.

In some embodiments, simulation module 107 can apply one or more simulation conditions 175 to the one or more operations simulated by simulation model 173. For example, simulation module 107 can execute simulation model 173 to simulate a particular set of operations, simulate one or more operations for a particular time period, simulate a particular number of substrates, simulate substrates having particular identifiers, and so forth. In some embodiments, simulation conditions 175 can be default conditions set by a component of production environment 100 (e.g., CIM system 101, time constraint manager 110, production dispatcher system 103) during the initialization of production environment 110. In other or similar embodiments, simulation conditions 175 can be provided to simulation module 107 during operation of production environment 100 by a component of production environment 100 or a user of production environment 100 (e.g., via user device 114).

During execution of the simulation model 173, an operation can invoke a dispatching decision. For example, an operation can trigger (e.g., call) a decision of a simulated manufacturing equipment 112 to perform a simulated operation for a simulated substrate. Simulation module 107 can identify a dispatching rule 151 (e.g., from data store 150) associated with the dispatching decision and use simulation model 173 to make the dispatching decision in accordance with the identified dispatching rule 151.

In some embodiments, one or more input parameters can be provided to the dispatching rule 151 for simulation model 173 to make the dispatching decision. The one or more input parameters can include state data 153 associated with one or more simulated manufacturing equipment 112. State data 153 can include a state of manufacturing equipment 112 (e.g., an operating temperature, an operating pressure, a number of substrates being processed at the manufacturing equipment, a number of substrates in a manufacturing equipment queue, etc.) at a particular instance of time. State data 153 can be generated by manufacturing equipment 112 during operation of production environment 100 and stored at data store 150. In other or similar embodiments, the one or more input parameters can include user data 155. User data 155 can include data provided by a user of production environment 100 (e.g., an operator, a process engineer, industrial engineer, system engineer, etc.). In some embodiments, user data 155 can be provided via user device 114. Simulation module 107 can identify a parameter value (e.g., state data 153, user data 155, etc.) from data store 150 and provide the parameter value to simulation model 173 to be used for the one or more input parameters provided for dispatching rule 151.

Simulation module 107 can run simulation model 173 to represent an extended amount of time at production environment 100. For example, simulation module 107 can run simulation model 173 to simulate an hour, several hours, several days, a week, and so forth, of operation of production environment 100. During the simulation, simulation model 173 can make a significant number of dispatching decisions. Simulation module 107 can generate a report associated with the simulation and/or the dispatching decisions made by simulation model 173. In some embodiments, the report can include data corresponding to, for example, production cycle time, production throughput, equipment utilization, etc. Simulation module 107 can provide the report to one or more components of production environment 100 (e.g., time constraint manager 110, production dispatcher system 103, CIM system 101, etc.) and/or to a user of production environment 100 (e.g., via user device 114).

In some embodiments, time constraint window manager 110 can determine the number of substrates to be initiated for a set of operations for a particular time period of the manufacturing system based on a simulation of the production environment 100. Time constraint window manager 110 can determine one or more simulation conditions 175 to be applied to a simulation performed by simulation model 173. The one or more simulation conditions can include, the particular set of operations to be simulated, the particular time period to be simulated, a number of substrates to be simulated, an identification of particular substrates to be simulated, etc. In some embodiments, time constraint window manager 110 determines the one or more simulation conditions 175 based on a notification received from production dispatcher system 103 or a user of production environment 100 (e.g., via user device 114). In other or similar embodiments, time constraint window manager 110 determines the one or more simulation conditions 175 based on state data 154 associated with manufacturing equipment 112. For example, time constraint window manager 110 can determine, based on state data 154, that 100 substrates were successfully processed according to a first set of operations having time constraints within a 12 hour time period. As such, time constraint window manager 110 can determine the set of operations to be simulated are the first set of operations, the particular time period to be simulated is a 12 hour time period, and a number of substrates to be simulated is 100. Time constraint window manager can provide the simulation conditions to simulation module 107 and simulation module 107 can execute simulation models 173 based on the simulation conditions, in accordance with previously described embodiments.

Simulation module 107 can generate a report associated with the simulation for the set of operations for the particular time period of the manufacturing system. In some embodiments, the report can include data corresponding to, for example, a production throughput for a particular number of substrates simulated by simulation model 173. For example, the report can include an indication that, for 100 simulated substrates, 90 simulated substrates were successfully processed during each of the simulated set of operations to reach the end of the particular time period. Simulation module 107 can transmit the report to time constraint manager 110. In some embodiments, simulation module 107, or time constraint window manager 110, can transmit the report to user device 114. User device 114 can provide data from the report to a user of the manufacturing system via a graphical user interface (GUI) displayed via the user device 114, such as GUI 500 illustrated in FIG. 5.

In response to receiving the report from simulation module 107, time constraint manager 110 can determine the number of substrates to be started at an initiating operation (i.e., of a set of operations to be performed at manufacturing equipment 112) of a time constraint window for a particular time period. As discussed previously, the determined number of substrates is referred to as a substrate limit 111. Time constraint window manager 110 can provide the substrate limit 111 to production dispatcher system 103. As described previously, production dispatcher system 103 can use the substrate limit 111 to determine whether to start processing of one or more substrates at the initiating operation during the particular time period.

Figure 2:
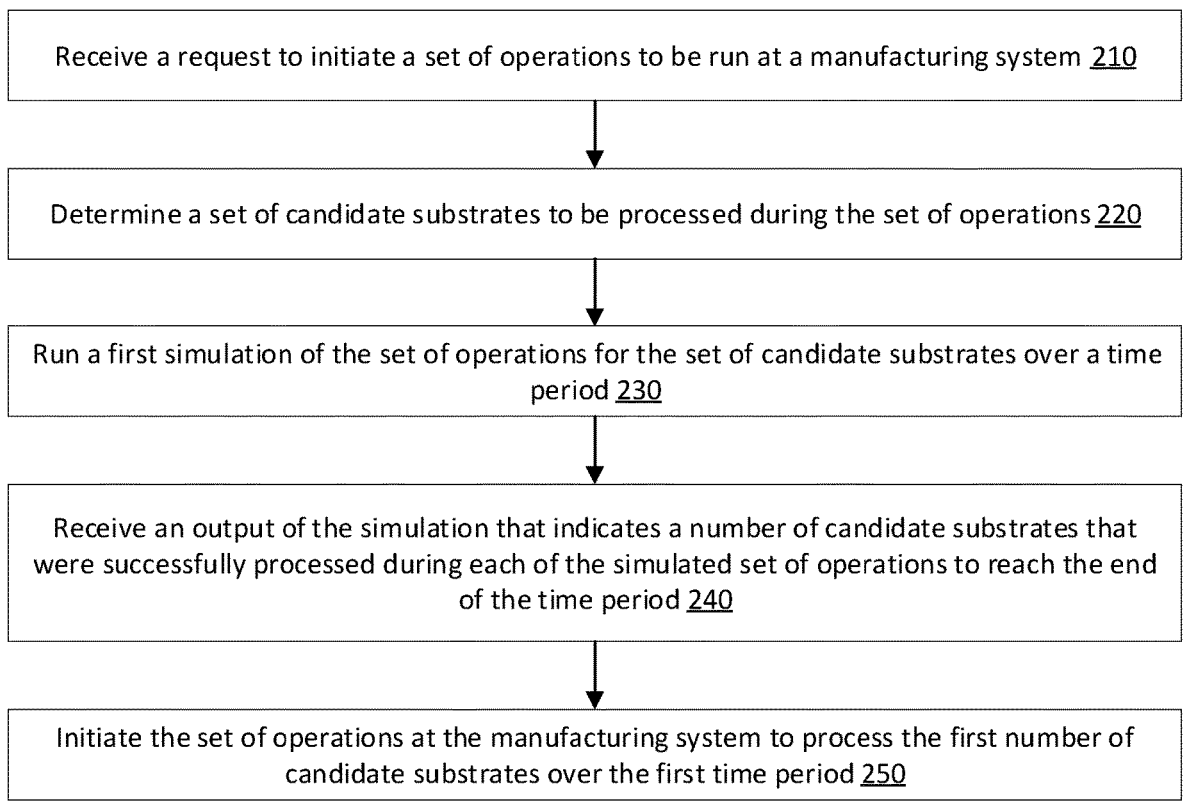
FIG. 2 is a flow diagram of a method for time constraint management, according to aspects of the present disclosure.
Figure 3:
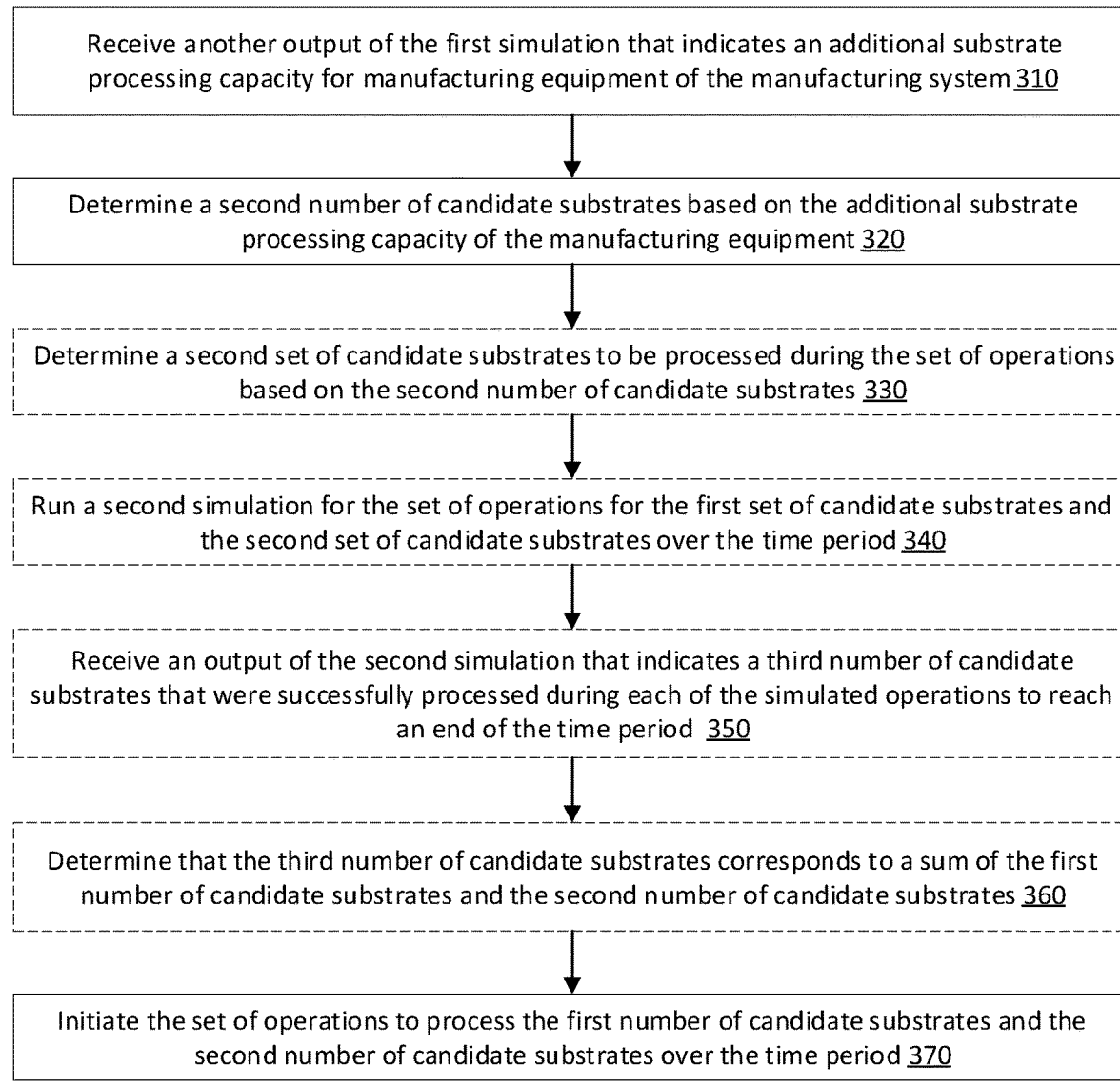
FIG. 3 is a flow diagram of another method for time constraint management, according to aspects of the present disclosure.

FIGS. 2 and 3 are flow diagrams for methods 200, 300 for time constraint management, according to aspects of the present disclosure. Methods 200, 300 are performed by processing logic that can include hardware (circuitry, dedicated logic, etc.), software (such as is run on a general purpose computer system or a dedicated machine), firmware, or some combination thereof. Some operations of methods 200, 300 can be performed by a processing device, such as time constraint window manager 110 of FIG. 1.

For simplicity of explanation, methods 200, 300 are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events.

Referring now to FIG. 2, at block 210, the processing device receives a request to initiate a set of operations to be run at a manufacturing system. In some embodiments, the manufacturing system can be production environment 100 of FIG. 1. In some embodiments, the request can be a request to initiate the set of operations to be run at the manufacturing system at a particular instance in time. For example, the request can be a request to initiate the set of operations at 8:00 p.m.

Figure 4:
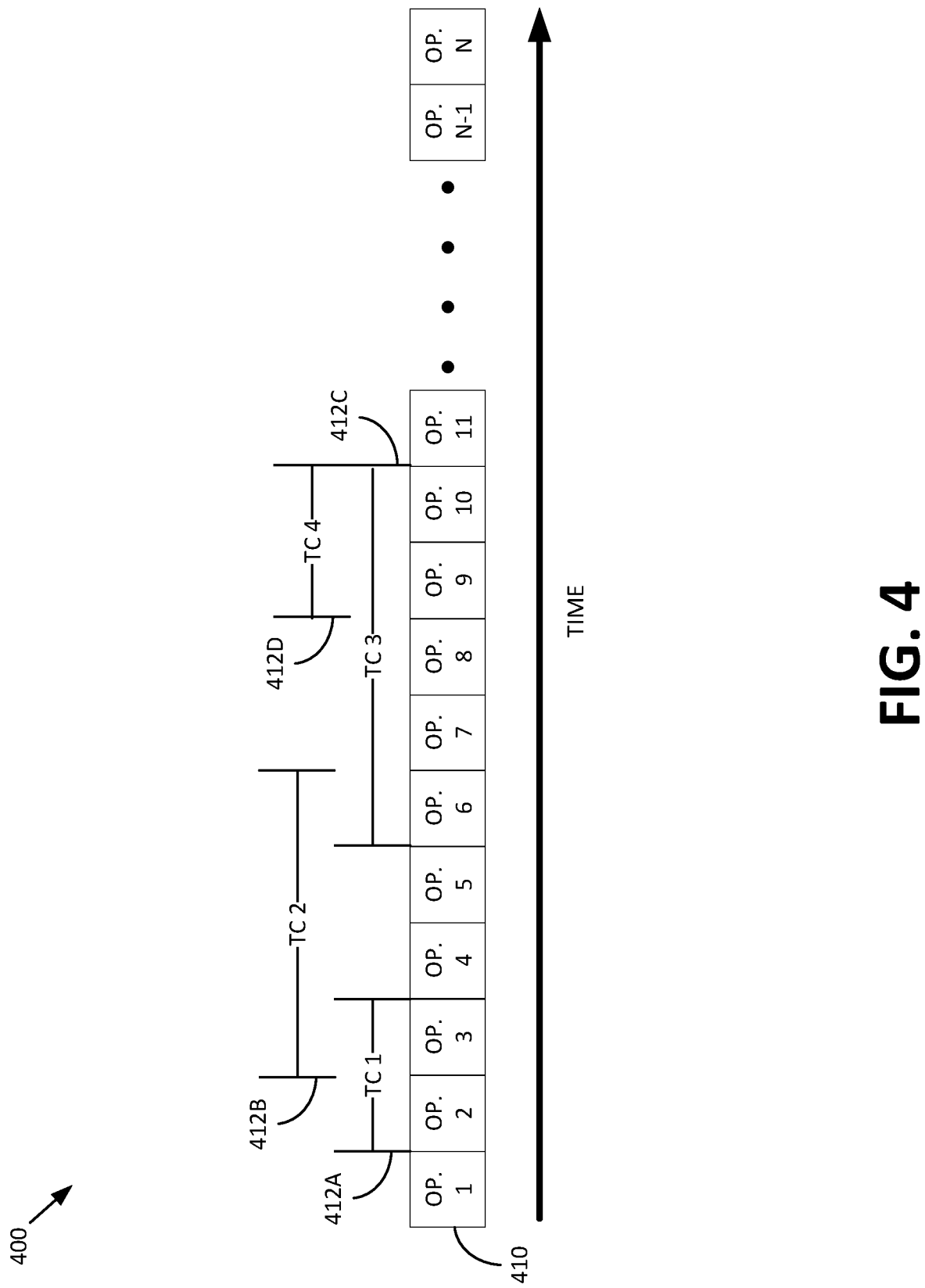
FIG. 4 illustrates a set of operations subject to one or more time constraints, according to aspects of the present disclosure.

In some embodiments, the set of operations can be the set of operations illustrated by FIG. 4. FIG. 4 illustrates a set of operations 400 subject to one or more time constraints, according to embodiments of the present disclosure. Each operation 410 can correspond to an individual process performed at one or more manufacturing facilities of a production environment, such as manufacturing equipment 112 (e.g., a tool or automated device) of production environment 100. In some embodiments, each of the set of operations 400 can be consecutive operation (i.e., each operation 410 is performed in accordance with a particular ordering). In some embodiments, each operation 410 can correspond to an individual process performed at a front-end manufacturing facility, including, but not limited to, photolithography, deposition, etching, cleaning, ion implantation, chemical and mechanical polishing, etc. In other or similar embodiments, each operation 410 can correspond to an individual process performed at a back-end manufacturing facility, including, but not limited to, dicing a completed wafer into individual semiconductor die, testing, assembly, packaging, etc.

As described previously, one or more operations 410 can be subjected to a time constraint. For example, operation 2 can be a first deposition operation to deposit a first material on a surface of a substrate and operation 3 can be a second deposition operation to deposit a second material on the first material. Operations 2 and 3 can be subject to a first time constraint where the second material is to be deposited on the first material within a particular amount of time (e.g., 6 hours) after deposition of the first material on the surface of the substrate. An amount of time for manufacturing equipment 112 to perform operations 2 and 3 can correspond to a time constraint window 412. The time constraint window 412 can include a first amount of time to complete an initiating operation (i.e., an operation 410 that initiates a time constraint window 412) and the particular amount of time in which manufacturing equipment 112 is to complete a completion operation (i.e., an operation 410 that completes the time constraint window 412). In accordance with the previous example, operation 2 is to be started for a substrate at manufacturing equipment 112 so that operations 2 and 3 will be completed for the substrate within a first time constraint window 412A.

In some embodiments, a completion operation of a time constraint window 412 can be an initiating operation for another time constraint window 412. For example, operation 3 can be a second deposition operation and operation 6 can be an etching operation. Operations 3, 4, 5, and 6 can be subject to a time constraint where the second material is to be etched at operation 6 within a particular amount of time (e.g., 12 hours) after deposition of the second material at operation 3. A second time constraint window 412B can include an amount of time to deposit the second material at operation 3 and the particular amount of time to complete operation 6. Operation 3 is to be started at manufacturing equipment 112 so that operations 3, 4, 5, and 6 will be completed within the second time constraint window 412B. In accordance with the previous example, operation 3 can be subject to a time constraint with operation 2. As such, operation 2 is to be started for a substrate so that operations 2 and 3 will be completed for the substrate within the first time constraint window 412A and that operations 3, 4, 5, and 6 will be completed within the second time constraint window 412B. The first time constraint window 412A and the second time constraint window 412B together are referred to a cascading time constraint window.

In some embodiments, an operation 410 can be subject to more than one time constraint. For example, operations 6, 7, 8, 9, and 10 can be subject to a first time constraint where operation 10 is to be completed within a particular amount of time after operation 6 is completed. A third time constraint window 412C can include an amount of time to perform operation 6 and the particular amount of time to complete operation 10. Operations 9 an 10 can also be subject to a second time constraint where operation 10 is to be completed within a particular amount of time after operation 9 is completed. A fourth time constraint window 412D can include an amount of time to complete operation 9 and the particular amount of time to complete operation 10. As such, operation 6 is to be started so that operations 6, 7, 8, 9, and 10 will be completed within the third time constraint window 412D and operations 9 and 10 will be completed within the fourth time constraint window. The third time constraint window 412C and the fourth time constraint window 412 together are referred to a nested time constraint window.

Referring back to FIG. 2, at block 220, the processing device (e.g., time constraint window manager 110) determines a set of candidate substrates to be processed during the set of operations. The set of candidate substrates can be a simulation condition, as described with respect to FIG. 1 In some embodiments, time constraint window manager 110 can identify particular candidate substrates to be processed during the set of operations 400. For example, a component of production environment 100 (e.g., CIM system 101, production dispatcher system 103, etc.) can maintain a queue of substrates to be processed according to the set of operations 400. In some embodiments, time constraint window manager 110 can determine the set of candidate substrates includes each substrate of the queue. In other or similar embodiments, time constraint window manager 110 can determine the set of candidate substrates includes particular substrates included in the queue of substrates. For example, time constraint window manager 110 can identify a particular number of substrates (e.g., 100 substrates) that at a top of the queue (i.e., the next substrates in the queue to be processed during the set of operations) to be included in the set of candidate substrates. In some embodiments, the particular number of substrates can be identified based on a previous number of substrates to be processed during the set of operations. Time constraint window manager 110 can determine additional simulation conditions, in accordance with previously described embodiments.

At block 230, the processing device runs a first simulation of the set of operations for the set of candidate substrates over a time period. In some embodiments, the processing device (e.g., time constraint window manager 110), can determine a particular time period the set of operations 400 are to be run at the manufacturing system. The particular time period can be a simulation condition, in accordance with previously described embodiments. Time constraint window manager 110 can determine the time period by identifying a largest time constraint window for the set of operations 400. For example, time constraint window manager 110 can determine a set of time constraint windows (e.g., time constraint windows 412A, 412B, 412C, 412D) for the set of operations 400. The set of time constraint windows can also include each cascading time constraint and nested time constraint window for the set of operations 400. Time constraint window manager 110 can identify the largest time constraint window of the set of time constraint windows for the set of operations 400. For example, as discussed previously, time constraint windows 412A, B, and C can be a cascading time constraint window. As such, operation 2 is to be started so that each of operations 2-10 will be completed within the first time constraint window 412A, second time constraint window 412B, and third time constraint window 412C. As seen in FIG. 4A, the cascading time constraint window including time constraint windows 412A, 412B, and 412C is the largest time constraint window for the set of operations 400. As such, time constraint window manager 110 can determine the specific time period for the simulated set of operations to be the amount of time corresponding to the cascading time constraint window including time constraint windows 412A, 412B, and 412C.

In some embodiments, the particular time period can be further determined based on a particular instance in time the set of operations are to be run at the manufacturing system. For example, at block 210, time constraint window manager 110 can receive a request to initiate the set operations 400 to be run at the manufacturing system at 8:00 p.m. Time constraint window manager 110 can determine that the largest time constraint window for the set of operations 400 is 12 hours, in accordance with previously described embodiments, Therefore, time constraint window manager 110 can determine the time period to be between 8:00 p.m. and 8:00 a.m.

In response to determining the one or more simulation conditions to be applied to the simulated set of operations (e.g., the time period, etc.), time constraint window manager 110 can run the first simulation of the set of operations over the time period (e.g., between 8:00 p.m. and 8:00 a.m.), in accordance with previously described embodiments.

At block 240, the processing device receives a first output of the simulation that indicates a number of candidate substrates that were successfully processed during each of the simulated set of operations to reach the end of the time period. In some embodiments, simulation module 107 can generate a report associated with the simulation, in accordance with previously described embodiments. The report can indicate the number of candidate substrates, of the set of candidate substrates, that were successfully processed during each of the simulated set of operations to reach the end of the time period. For example, referring to FIG. 4, the processing device (e.g., time constraint window manager 110) can run the simulation for the set of operations 400 for a set of 100 candidate substrates over the time period associated with the cascading time constraint window including time constraint windows 412A, 412B, and 412C (e.g., 12 hours). The output of the simulation can indicate that 90 candidate substrates of the 100 candidate substrates were successfully processed during each of the simulated set of operations to reach the end of the time period (e.g., to complete operation 10).

In some embodiments, time constraint window manager 110 can run a second simulation to verify the number of candidate substrates identified by the first simulation. For example, time constraint window manager 110 can run a second simulation of the 90 successful candidate substrates included in the first simulation output. Time constraint window manager 110 can receive a second simulation output indicating a second number of successful candidate substrates. Responsive to determining that each of the number of candidate substrates identified by the first simulation are included in the second simulation output, method 200 can continue to block 250.

At block 250, the processing device initiates, in view of the first simulation output, the set of operations at the manufacturing system to process the first number of candidate substrates over the time period. In some embodiments, the processing device initiates the set of operations 400 at the manufacturing system by setting a substrate limit 111 for a first operation 410 of the set of operations 400 to correspond to the first number of candidate substrates. As described previously, time constraint window manager 110 can set the substrate limit 111 for the first operation 410 by providing the first number of candidate substrates to production dispatcher system 103. Production dispatcher system 103 can use a substrate counter value to monitor whether a number of substrates started at the initiating operation satisfies the substrate limit 111 over the time period. For example, for each substrate started at the initiating operation of the set of operations 400, production dispatcher system 103 can update the substrate counter value by decreasing the substrate counter value by one. The updated substrate counter value can indicate to the production dispatcher system 103 the number of substrates of the substrate queue that can be started that the initiating operation within the time period. (e.g., between 8:00 p.m. and 8:00 a.m., based on the previous example).

The processing device can run multiple simulations of the set of operations 410 during the time period (e.g., between 8:00 p.m. and 8:00 a.m.). In some embodiments, a user of the manufacturing system can request that a simulation be run for the manufacturing system at particular instances of time (e.g., every 4 hours). In other or similar embodiments, the processing device can run another simulation in response to determining a state of the manufacturing system has changed. For example, at 8:00 p.m., one or more manufacturing equipment 112 at the manufacturing system may be unable to perform any of the set of operations 410 (e.g., the manufacturing equipment 112 is unavailable for repair, etc.). At 12:00 a.m., the manufacturing equipment 112 may be available to perform an operation 410 (e.g., the manufacturing equipment 112 has been repaired). At or prior to 12:00 p.m., an operator of the manufacturing system can transmit a request to initiate the set of operations to be run at the manufacturing system at 12:00 a.m. Responsive to receiving the request, time constraint window manager 110 can determine a second set of candidate substrates to be processed during the set of operations 400 and run a second simulation of the set of operations for the second set of substrates over another time period. In such example, the time constraint window manager 110 can determine the time period is to be between 12:00 a.m. and 12:00 p.m., in accordance with previously disclosed embodiments. The second simulation can generate a second simulation output indicating a second number of candidate substrates that were successfully processed during each of the simulated set of operations to reach the end of the second time period. In response to receiving the second number of candidate substrates, time constraint window manager 110 can update the substrate limit 111 for the first operation 410 of the set of operations 400 by providing the second number of candidate substrates to the production dispatcher system 103. Production dispatcher system 103 can use a substrate counter value to monitor whether a number of substrates started at the first operation 410 satisfies the substrate limit 111 over the time period of 12:00 a.m. to 12:00 a.m.

FIG. 3 is a flow diagram of another method 300 for time constraint management, according to aspects of the present disclosure. As described previously, method 300 can be performed by a processing device, such as time constraint window manager 110 of FIG. 1. In some embodiments, one or more acts depicted and described for method 300 can correspond to an act depicted and described for method 20. In other or similar embodiments, the one or more of the series of acts depicted and described for method 300 can be performed responsive to a performance of one or more of the series of acts depicted and described for method 200.

At block 310, the processing device receives a second output of the first simulation that indicates an additional substrate processing capacity for manufacturing equipment of the manufacturing system. In some embodiments, the manufacturing equipment can be manufacturing equipment 112 of production environment 100, described with respect to FIG. 1. The first simulation can be the simulation described with respect to FIG. 2. In some embodiments, the second output of the first simulation can indicate a number of substrates not included in the first set of candidate substrates that could have been processed at manufacturing equipment 112 during the time period. For example, referring to FIG. 4, time constraint window manager 110 can run the first simulation for the set of operations 400 for a set of 100 candidate substrates over the time period associated with the cascading time constraint window including time constraint windows 412A, 412B, and 412C (e.g., 12 hours). The a first output of the first simulation can indicate that each of the 100 candidate substrates were successfully processed during each of the simulated set of operations to reach the end of the time period (e.g., to complete operation 10). The second output of the first simulation can indicate that 10 additional substrates not included in the set of 100 candidate substrates could have been successfully processed during each of the simulated set of operations to reach the end of the time period.

In other or similar embodiments, the second output of the first simulation can correspond to estimated state data for the manufacturing equipment 112 during a portion of the first time period. For example, the second output can indicate an amount of time during the first time period that the manufacturing equipment 112 was idle (i.e., not processing any substrates).

At block 320, the processing device (e.g., time constraint window manager 110) determines a second number of candidate substrates based on the additional substrate processing capacity of manufacturing equipment of a manufacturing system. In some embodiments, time constraint window manager 110 can determine the second number of candidate substrates based on a number of substrates not included in the first set of candidate substrates that could have been processed at manufacturing equipment 112. In other or similar embodiments, time constraint window manager 110 can determine the second number of candidate substrates based on the estimated state data for manufacturing equipment 112 during a portion of the first time period. For example, time constraint window manager 110 can determine a number of substrates that could have been processed during the first time period that the manufacturing equipment 112 was idle.

At block 330, the processing device optionally identifies a second set of candidate substrates to be processed during the set of operations. The processing device can determine the second set of candidate substrates based on the second number of candidate substrates. In some embodiments, the processing device can identify the second set of substrates from a substrate queue, in accordance with previously described embodiments. In accordance with the previous example, the second output of the first simulation can indicate that 10 additional substrates not included in the set of 100 candidate substrates could have been successfully processed during each of the simulated set of operations to reach the end of the time period. As described previously, time constraint window manager 110 determines the set of 100 candidate substrates by identifying 100 substrates at the top of the queue. Time constraint window manager 110 can determine the second set of candidate substrates by identifying 10 substrates of the queue that follow the identified 100 substrates at the top of the queue.

At block 340, the processing device optionally runs a second simulation for the set of operations for the first set of candidate substrates and the second set of candidate substrates over the time period. The processing device can run the second simulation in accordance with previously described embodiments. At block 350, the processing device optionally receives an output of the second simulation that indicates a third number of candidate substrates that were successfully processed during each of the simulated operations to reach an end of the time period.

At block 360, the processing device optionally determines that the third number of candidate substrates corresponds to a sum of the first number of candidate substrates and the second number of candidate substrates. In response to the processing device determining the third number of candidate substrates corresponds to the sum of the first number of candidate substrates and the second number of candidate substrates, method 300 continues to block 370. In accordance with the previous example, time constraint window manager 110 can run the second simulation for the set of operations for the set of 100 candidate substrates and the set of 10 candidate substrates. The output of the second simulation can indicate that 110 total candidate substrates (e.g., the each of the set of 100 candidate substrates and each of the set of 10 candidate substrates) were successfully processed during each of the simulated operations to reach the end of the time period. Time constraint window manager 110 can therefore determine that the third number of candidate substrates (e.g., 110 candidate substrates) corresponds to the sum of the first number of candidate substrates (e.g., 100 candidate substrates) and the second number of candidate substrates (e.g., 10 candidate substrates).

In some embodiments, the processing device can optionally determine that the third number of candidate substrates does not correspond to the sum of the first number of candidate substrates and the second number of candidate substrates. In accordance with the previous example, the output of the second simulation can indicate that 105 total candidate substrates were successfully processed during each of the simulated operations to reach the end of the time period. Time constraint window manager 110 can determine that the third number of candidate substrates (e.g., 105 candidate substrates) does not correspond to the sum of the first number of candidate substrates (e.g., 100 candidate substrates) and the second number of candidate substrates (e.g., 10 candidate substrates). In such embodiments, the processing device can optionally run a third simulation for the set of operations for the third number of candidate substrates (e.g., 105 candidate substrates) and receive an output of the third simulation that indicates a fourth number of candidate substrates that were successfully processed during each of the simulated operations to reach an end of the time period. In other or similar embodiments, the processing device can initiate the set of operations to process the third number of candidate substrates over the time period.

At block 370, the processing device initiates the set of operations to process the first number of candidate substrates and the second number of candidate substrates over the period of time, in accordance with previously described embodiments.

Figure 5:
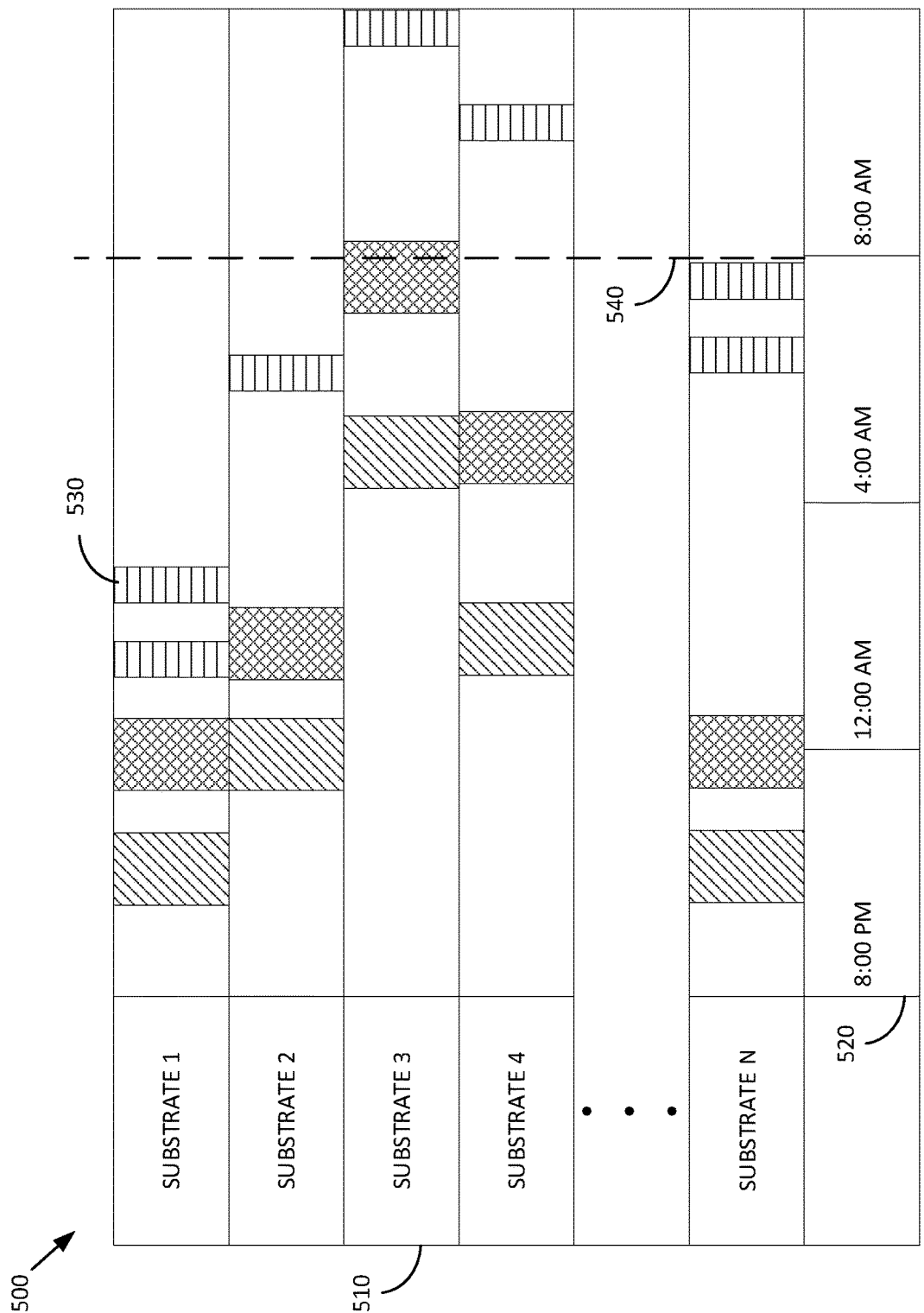
FIG. 5 illustrates a graphical user interface (GUI) to provide one or more simulation outputs to a user of a manufacturing system, according to aspects of the present disclosure.

FIG. 5 illustrates a graphical user interface (GUI) 500 to provide one or more simulation outputs to a user of a manufacturing system, according to aspects of the present disclosure. In some embodiments, GUI 500 can be presented to a user of a manufacturing system (i.e., via user device 114 of FIG. 1) after a simulation is performed for the manufacturing system. GUI 500 can depict data corresponding to an output of a simulation of the manufacturing system for a particular period of time. For example a simulation can be run for each of a set of substrates, illustrated by GUI elements 520, for a time period between 8:00 p.m. and 8:00 a.m., as indicated by GUI elements 520. GUI elements 530 can indicate one or more operations performed at manufacturing equipment 112 of the manufacturing system. A size and/or style of GUI elements 530 can correspond to an amount of time the operation was performed and the type of operation performed at the manufacturing equipment 112. A user of the manufacturing system can determine whether a substrate is likely to be successfully processed within a time constraint window using data provided by GUI 500. For example, a time constraint window can correspond to an amount of time between 8:00 p.m. and 8:00 a.m. Four operations, illustrated by GUI elements 530, are to be completed within the time constraint window. A user can determine the substrates that are likely to be successfully processed during the time constraint window by identifying the substrates 510 that have been processed according to all four operations 530 prior to the end of the time constraint window (i.e., substrates, 1, 2, and N), illustrated by line 540. A user can similarly determine the substrates that are not likely to be successfully processed during the time constraint window by identifying the substrates 510 that are not processed according to all four operations 530 prior to the end of the time constraint window (i.e., substrates 3 and 4).

Figure 6:
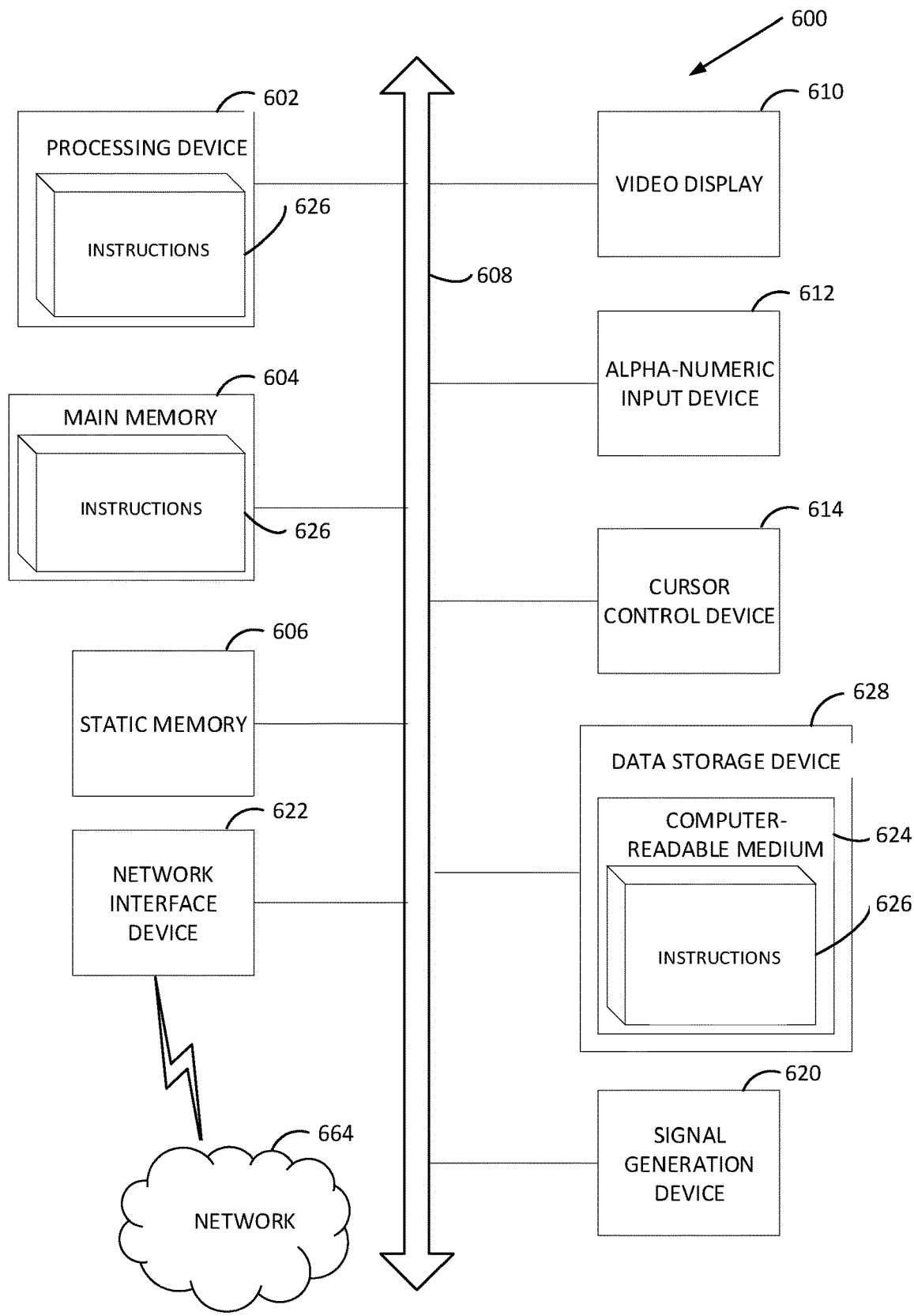
FIG. 6 is a block diagram illustrating a computer system, according to certain embodiments.

FIG. 6 is a block diagram illustrating a computer system 600, according to certain embodiments. FIG. 6 illustrates a diagrammatic representation of a machine in the example form of a computing device 600 within which a set of instructions, for causing the machine to perform any one or more of the methodologies discussed herein, can be executed. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 600 can correspond to time constraint window manager 110 of FIG. 1.

The example computing device 600 includes a processing device 602, a main memory 604 (e.g., read-only memory (ROM), flash memory, dynamic random access memory (DRAM) such as synchronous DRAM (SDRAM), etc.), a static memory 606 (e.g., flash memory, static random access memory (SRAM), etc.), and a secondary memory (e.g., a data storage device 528), which communicate with each other via a bus 608.

Processing device 602 can represent one or more general-purpose processors such as a microprocessor, central processing unit, or the like. More particularly, the processing device 602 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. Processing device 602 can also be or include a system on a chip (SoC), programmable logic controller (PLC), or other type of processing device. Processing device 602 is configured to execute the processing logic (instructions 626) for performing operations and steps discussed herein.

The computing device 600 can further include a network interface device 622 for communicating with a network 664. The computing device 600 also can include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 620 (e.g., a speaker).

The data storage device 628 can include a machine-readable storage medium (or more specifically a non-transitory computer-readable storage medium) 624 on which is stored one or more sets of instructions 626 embodying any one or more of the methodologies or functions described herein. Wherein a non-transitory storage medium refers to a storage medium other than a carrier wave. The instructions 626 can also reside, completely or at least partially, within the main memory 604 and/or within the processing device 602 during execution thereof by the computer device 600, the main memory 604 and the processing device 602 also constituting computer-readable storage media.

While the computer-readable storage medium 624 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   receiving a first request to initiate a set of operations to be run for a queue of substrates at a manufacturing system, wherein each of the set of operations corresponds to a respective substrate process of a set of substrate processes, and wherein one or more operations of the set of operations have one or more time constraints;
   identifying a first plurality of candidate substrates of the queue of substrates that are to be processed during the set of operations;
   determining a first simulation time period for a first simulation of the set of operations, wherein a size of the first simulation time period corresponds to at least an amount of time associated with a largest time constraint window of a combined set of time constraint windows corresponding to the one or more time constraints prompted by an initiating operation of the set of operations;

running the first simulation of the set of operations to simulate each respective substrate process of the set of substrate processes for the first plurality of candidate substrates over the first simulation time period, wherein the first simulation simulates the set of operations and a condition of an environment of one or more manufacturing equipment during processing according to the one or more operations, and wherein the first simulation generates a first simulation output indicating a first number of candidate substrates that were successfully processed during each of the simulated set of operations to reach an end of the first simulation time period in view of the one or more time constraints;

obtaining a second simulation output by running a second simulation of the successfully processed candidate substrates included in the first simulation output;

performing a verification process by determining whether each successfully processed candidate substrate identified in the first simulation output is included in the second simulation output; and responsive to determining that each successfully processed candidate substrate identified in the first simulation output is included in the second simulation output, initiating the set of operations at the manufacturing system to process the first number of candidate substrates from the queue of substrates according to each respective substrate process of the set of substrate processes over a time period corresponding to the first simulation time period.

2. The method of claim 1, wherein determining the first simulation time period for the first simulation of the set of operations comprises:

determining the set of time constraint windows based on each of the one or more operations of the set of operations that each have the one or more time constraints; and identifying, the largest time constraint window of the set of time constraint windows.

3. The method of claim 1, wherein initiating the set of operations at the manufacturing system to process the first number of candidate substrates comprises:

setting a substrate counter value for a first operation of the set of operations to correspond to the first number of candidate substrates, wherein the substrate counter value defines a total number of substrates at the manufacturing system to be initiated at the first operation over the first time period.

4. The method of claim 3, further comprising:

receiving a second request to initiate the set of operations to be run at the manufacturing system;

determining a second plurality of candidate substrates to be processed during the set of operations;

running a third simulation of the set of operations for the second plurality of candidate substrates over a second simulation time period, wherein the third simulation generates a third simulation output indicating a second number of candidate substrates that were successfully processed during each of the simulated set of operations to reach an end of the second simulation time period; and updating the substrate counter value for the first operation of the set of operations to correspond to the second number of candidate substrates.

5. The method of claim 1, wherein the first simulation further generates a third simulation output indicating an additional substrate processing capacity for a manufacturing equipment of the manufacturing system, the additional substrate processing capacity corresponding to a number of substrates that could be successfully processed at the manufacturing equipment within the first simulation time period, and wherein the method further comprises:

determining, based on the additional substrate processing capacity for the manufacturing equipment, a second number of candidate substrates, wherein the set of operations are initiated to process the first number of candidate substrates and the second number of candidate substrates over the first simulation time period.

6. The method of claim 5, further comprising:

identifying a second plurality of candidate substrates to be processed during the set of operations based on the second number of candidate substrates;

running a third simulation of the set of operations for the first plurality of candidate substrates and the second plurality of substrates over the first simulation time period, wherein the third simulation generates a third simulation output indicating a third number of candidate substrates that were successfully processed during each of the simulated set of operations to reach the end of the first simulation time period; and determining whether the third number of candidate substrates corresponds to a sum of the first number of candidate substrates and the second number of candidate substrates, wherein the set of operations are initiated to process the first number of candidate substrates and the second number of candidate substrates responsive to a determination that the third number of candidate substrates corresponds to a sum of the first number of candidate substrates and the second number of candidate substrates.

7. The method of claim 1, wherein the one or more time constraints for an operation of the set of operations each comprise an amount of time after completion of the operation that one or more subsequent operations of the set of operations are to be completed.

8. The method of claim 1, wherein the first simulation further simulates actions performed by an operator at the manufacturing system.

9. The method of claim 1, wherein a condition of an environment of the one or more manufacturing equipment comprises at least one of an operating pressure of the one or more manufacturing equipment, an operating temperature of the one or more manufacturing equipment, or a number of substrates being processed using the one or more manufacturing equipment.

10. A system comprising:

a memory; and a processing device coupled to the memory, the processing device to:

receive a first request to initiate a set of operations to be run for a queue of substrates at a manufacturing system, wherein each of the set of operations corresponds to a respective substrate process of a set of substrate process, and wherein one or more operations of the set of operations have one or more time constraints;

identify a first plurality of candidate substrates of the queue of substrates that to be processed during the set of operations;

determine a first simulation time period for a first simulation of the set of operations, wherein a size of the first simulation time period corresponds to at least an amount of time associated with a largest time constraint window of a combined set of time constraint windows corresponding to the one or more time constraints prompted by an initiating operation of the set of operations;

run the first simulation of the set of operations to simulate each respective substrate process of the set of substrate processes for the first plurality of candidate substrates over the first simulation time period, wherein the first simulation simulates the set of operations and a condition of an environment of one or more manufacturing equipment during processing according to the one or more operations, and wherein the first simulation generates a first simulation output indicating a first number of candidate substrates that were successfully processed during each of the simulated set of operations to reach an end of the first simulation time period in view of the one or more time constraints;

obtain a second simulation output by running a second simulation of the successfully processed candidate substrates included in the first simulation output;

perform a verification process by determining whether each successfully processed candidate substrate identified in the first simulation output is included in the second simulation output; and responsive to determining that each successfully processed candidate substrate identified in the first simulation output is included in the second simulation output, initiate the set of operations at the manufacturing system to process the first number of candidate substrates from the queue according to each respective substrate process of the set of substrate processes over a time period corresponding to the first simulation time period.

11. The system of claim 10, wherein to determine the first simulation time period for the first simulation of the set of operations, the processing device is to:

determine the set of time constraint windows based on each of the one or more operations of the set of operations that each have the one or more time constraints; and identify, the largest time constraint window of the set of time constraint windows.

12. The system of claim 10, wherein to initiate the set of operations at the manufacturing system to process the first number of candidate substrates, the processing device is to:

set a substrate counter value for a first operation of the set of operations to correspond to the first number of candidate substrates, wherein the substrate counter value defines a total number of substrates at the manufacturing system to be initiated at the first operation over the first time period.

13. The system of claim 12, wherein the processing device is further to:

receive a second request to initiate the set of operations to be run at the manufacturing system;

determine a second plurality of candidate substrates to be processed during the set of operations;

run a third simulation of the set of operations for the second plurality of candidate substrates over a second simulation time period, wherein the third simulation generates a third simulation output indicating a second number of candidate substrates that were successfully processed during each of the simulated set of operations to reach an end of the second simulation time period; and update the substrate counter value for the first operation of the set of operations to correspond to the second number of candidate substrates.

14. The system of claim 10, wherein the first simulation further generates a third simulation output indicating an additional substrate processing capacity for a manufacturing equipment of the manufacturing system, the additional substrate processing capacity corresponding to a number of substrates that could be successfully processed at the manufacturing equipment within the first simulation time period, and wherein the processing device is further to:

determine, based on the additional substrate processing capacity for the manufacturing equipment, a second number of candidate substrates, wherein the set of operations are initiated to process the first number of candidate substrates and the second number of candidate substrates over the first simulation time period.

15. The system of claim 14, wherein the processing device is further to:

identify a second plurality of candidate substrates to be processed during the set of operations based on the second number of candidate substrates;

run a third simulation of the set of operations for the first plurality of candidate substrates and the second plurality of substrates over the first simulation time period, wherein the third simulation generates a third simulation output indicating a third number of candidate substrates that were successfully processed during each of the simulated set of operations to reach the end of the first simulation time period; and determine whether the third number of candidate substrates corresponds to a sum of the first number of candidate substrates and the second number of candidate substrates, wherein the set of operations are initiated to process the first number of candidate substrates and the second number of candidate substrates responsive to a determination that the third number of candidate substrates corresponds to a sum of the first number of candidate substrates and the second number of candidate substrates.

16. The system of claim 10, wherein the one or more time constraints for an operation of the set of operations each comprise an amount of time after completion of the operation that one or more subsequent operations of the set of operations are to be completed.

17. A non-transitory computer readable storage medium comprising instructions that, when executed by a processing device, cause the processing device to:

receive a first request to initiate a set of operations to be run for a queue of substrates at a manufacturing system, wherein each of the set of operations corresponds to a respective substrate process of a set of substrate processes, and wherein one or more operations of the set of operations have one or more time constraints;

identify a first plurality of candidate substrates of the queue of substrates that are to be processed during the set of operations;

determine a first simulation time period for a first simulation of the set of operations, wherein a size of the first simulation time period corresponds to at least an amount of time associated with a largest time constraint window of a combined set of time constraint windows corresponding to the one or more time constraints prompted by an initiating operation of the set of operations;

run the first simulation of the set of operations to simulate each respective substrate process of the set of substrate processes for the first plurality of candidate substrates over the first simulation time period, wherein the first simulation simulates the set of operations and a condition of an environment of one or more manufacturing equipment during processing according to the one or more operations, and wherein the first simulation generates a first simulation output indicating a first number of candidate substrates that were successfully processed during each of the simulated set of operations to reach an end of the first simulation time period in view of the one or more time constraints;

obtain a second simulation output by running a second simulation of the successfully processed candidate substrates included in the first simulation output;

perform a verification process by determining whether each successfully processed candidate substrate identified in the first simulation output is included in the second simulation output; and responsive to determining that each successfully processed candidate substrate identified in the first simulation output is included in the second simulation output, initiate the set of operations at the manufacturing system to process the first number of candidate substrates from the queue of substrates according to each respective substrate process of the set of substrate processes over a time period corresponding to the first simulation time period.

18. The non-transitory computer readable storage medium of claim 17, wherein to determine the first simulation time period for the first simulation of the set of operations, the processing device is to:

determine the set of time constraint windows based on each of the one or more operations of the set of operations that each have the one or more time constraints; and identify, the largest time constraint window of the set of time constraint windows.

19. The non-transitory computer readable storage medium of claim 17, wherein to initiate the set of operations at the manufacturing system to process the first number of candidate substrates, the processing device is to:

set a substrate counter value for a first operation of the set of operations to correspond to the first number of candidate substrates, wherein the substrate counter value defines a total number of substrates at the manufacturing system to be initiated at the first operation over the first time period.

20. The non-transitory computer readable storage medium of claim 19, wherein the processing device is further to:

receive a second request to initiate the set of operations to be run at the manufacturing system;

determine a second plurality of candidate substrates to be processed during the set of operations;

run a third simulation of the set of operations for the second plurality of candidate substrates over a second simulation time period, wherein the third simulation generates a third simulation output indicating a second number of candidate substrates that were successfully processed during each of the simulated set of operations to reach an end of the second simulation time period; and update the substrate counter value for the first operation of the set of operations to correspond to the second number of candidate substrates.

* * * * *